United States Patent [19]

Lange

[11] Patent Number: 4,711,396

[45] Date of Patent: Dec. 8, 1987

[54] ELECTRICALLY ACTUATABLE FUEL-INJECTION VALVE FOR INTERNAL COMBUSTION ENGINES

[75] Inventor: Jürgen Lange, Eschborn, Fed. Rep. of Germany

[73] Assignee: VDO Adolf Schindling AG, Frankfurt am Main, Fed. Rep. of Germany

[21] Appl. No.: 861,483

[22] Filed: May 9, 1986

[30] Foreign Application Priority Data

May 13, 1985 [DE] Fed. Rep. of Germany ....... 3517258

[51] Int. Cl.[4] ........................ B05B 3/14; B05B 15/00; B05B 7/06; H01L 41/18

[52] U.S. Cl. .............................. 239/102.2; 239/132.5; 239/424; 239/425; 310/369

[58] Field of Search .................. 239/102.2, 104, 132.5, 239/424, 424.5, 425; 310/340, 367, 369; 261/DIG. 48

[56] References Cited

U.S. PATENT DOCUMENTS 4,004,733 1/1977 Law ................................ 239/424 X 4,372,491 2/1983 Fishgal ............................ 239/102.2

*Primary Examiner*—Andres Kashnikow

*Assistant Examiner*—Patrick N. Burkhart

*Attorney, Agent, or Firm*—Martin A. Farber

[57] ABSTRACT

In an electrically actuatable fuel-injection valve for internal combustion engines, a piezoelectric oscillator (radial oscillator 11) which is provided with electrodes has at least one fuel-receiving chamber (12). The chamber (12) is in communication with the fuel feed path (constant-volume chamber 20) and an ejection opening (bore 17). The oscillator (11) is mounted in a block (18) out of which the fuel feed path (constant-volume chamber 20) is also formed. Furthermore, a high-voltage generator (35) is located, electrically shielded from the outside, within the block (18), which consists of metal. The high-voltage generator is connected to the electrodes of the piezoelectric oscillator (11) via feed lines (14, 15) which are conducted within the block (18).

2 Claims, 2 Drawing Figures

ELECTRICALLY ACTUATABLE FUEL-INJECTION VALVE FOR INTERNAL COMBUSTION ENGINES

RELATED APPLICATIONS

This application is related to co-pending application Ser. Nos. 06/861,482 and 06/861,484 both filed on May 9, 1986.

FIELD AND BACKGROUND OF THE INVENTION

The present invention relates to an electrically actuatable fuel-injection valve.

An electrically actuatable fuel-injection valve for internal combustion engines has a piezoelectric oscillator which is provided with electrodes, and has at least one fuelreceiving chamber which is in communication with a fuel feed path and with an ejection opening (outlet opening), the valve having a block in which the oscillator is mounted and out of which, in particular, the fuel feed path is formed.

This device is an electrically actuatable fuel-injection valve for internal combustion engines which is characterized by the fact that it has a piezoelectric oscillator which is provided with electrodes and has at least one fuel-receiving chamber, that a fuel feed path and an ejection opening (outlet opening) are in fuel-conducting communication with the chamber and are so shaped that, upon the application of a voltage to the electrodes, the fuel is imparted a preferred movement through the chamber to the ejection opening. In particular, the piezoelectric oscillator is mounted in a block out of which the fuel feed path is formed. The piezoelectric oscillator is preferably developed as a hollow cylindrical radial oscillator in whose wall a number of fuelreceiving chambers are arranged parallel and concentric to its longitudinal axis. One end of the radial oscillator with the continuous chambers extends preferably into an annular constant-volume chamber which is formed out of the block concentrically to the longitudinal axis.

The fuel-injection valve operates in accordance with the principle that, after the application of an electric voltage to the electrodes of the piezoelectric oscillator, and the corresponding formation of an electric field between the electrodes of the oscillator and corresponding change in thickness, the oscillator, without any element which is movable as a whole and in particular without a displaceable valve needle, determines the preferred direction of movement in which the fuel is injected into the surrounds of the fuel-injection valve. In this connection, the fuel-injection valve measures the required injection amount and creates the requisite condition for the atomizing of the fuel. This is achieved in the manner that, due to the electric field, upon the application of the high voltage to the electrodes of the piezoelectric oscillator, the latter contracts or expands so that the volume of the fuel-receiving chamber changes and that, upon a reduction in volume of the chamber, the fuel emerges essentially from the ejection opening while the return flow of fuel through the fuel feed path is substantially throttled.

For the operation of the piezoelectric oscillator a high voltage is necessary which is to be fed to the electrodes of the oscillator. This controlled high voltage can cause interference in other electrical systems including, in particular, radio systems which are located in the vicinity of the high voltage generator and the high-voltage lines to the fuel-injection valve with the oscillator.

SUMMARY OF THE INVENTION

It is an object of the invention so to develop the fuel-injection valve of the above-mentioned type that interference caused by high operating voltages of the oscillator is avoided.

This object is achieved by the following development of the block in which the oscillator is arranged. That is, according to the invention, a high-voltage generator (35) is arranged, shielded electrically from the outside, within a metal block (18) and is connected to the electrodes of the piezoelectric oscillator (ring oscillator 11) by feed lines (14, 15) which are conducted within the block. The block, which consists of metal and thus shields off electrical fields well, is used here at the same time for the provision of a high-voltage generator circuit. Therefore only a low supply voltage which does not produce any interference is fed to the block which has this high-voltage generator circuit. Furthermore, by the arranging of the high-voltage generator circuit in the block, to which a ground connection with the surrounding metal parts can easily be produced, the danger of persons coming into contact with parts which are under high voltage is avoided.

The fuel-injection valve with the block is preferably so developed that the high-voltage generator (35) circuit is arranged in a hollow space which is separated from the fuel-conducting parts. This hollow space is referred to below also as a shielding chamber. Here, the high-voltage generator (35) is arranged in a shielding chamber (36) within the block (18), said chamber being sealed off from fuel-conducting parts (in particular the constant-volume chamber 20) of the block. Furthermore, there is preferably provided on the block (18) a low-voltage connector (38) which is connected within the block to the high-voltage generator (35) circuit. In this way, the block with the piezoelectric oscillator can be easily mounted and connected to the source of supply voltage. Testing and possible replacement of the block together with the high-voltage generator circuit are also facilitated.

As high-voltage generator circuit (FIG. 2) there is preferably used a diode-capacitor cascade circuit which can be developed compactly and therefore can be easily arranged in the block.

One particularly compact development of the block having the hollow space which receives the high-voltage generator circuit is as follows: An electrically actuatable fuel-injection valve within the block of which there is mounted as piezoelectric oscillator a hollow cylindrical radial oscillator within the wall of which a number of continuous fuel-receiving chambers are arranged extending parallel to its longitudinal axis and concentric to the longitudinal axis, one end of the radial oscillator extending with the chambers into an annular constant-volume chamber which is formed out of the block concentrically to its longitudinal axis, wherein the shielding chamber (36) which receives the high-voltage generator (35), is also developed annularly and concentrically to the longitudinal axis (19) of the block (18) separated from the constant-volume chamber (20), and the annular shielding chamber (36) adjoins a central passage bore (29) which conducts intake air. In this arrangement the hollow space can furthermore be cooled by a central passage bore through which the inner intake air flows.

BRIEF DESCRIPTION OF THE DRAWINGS

With the above and other objects and advantages in view, the present invention will become more clearly understood in connection with the detailed description of a preferred embodiment, when considered with the accompanying drawings, of which.

DETAILED DESCRIPTION OF THE PREFERRED EMBODIMENT

Figure 1:
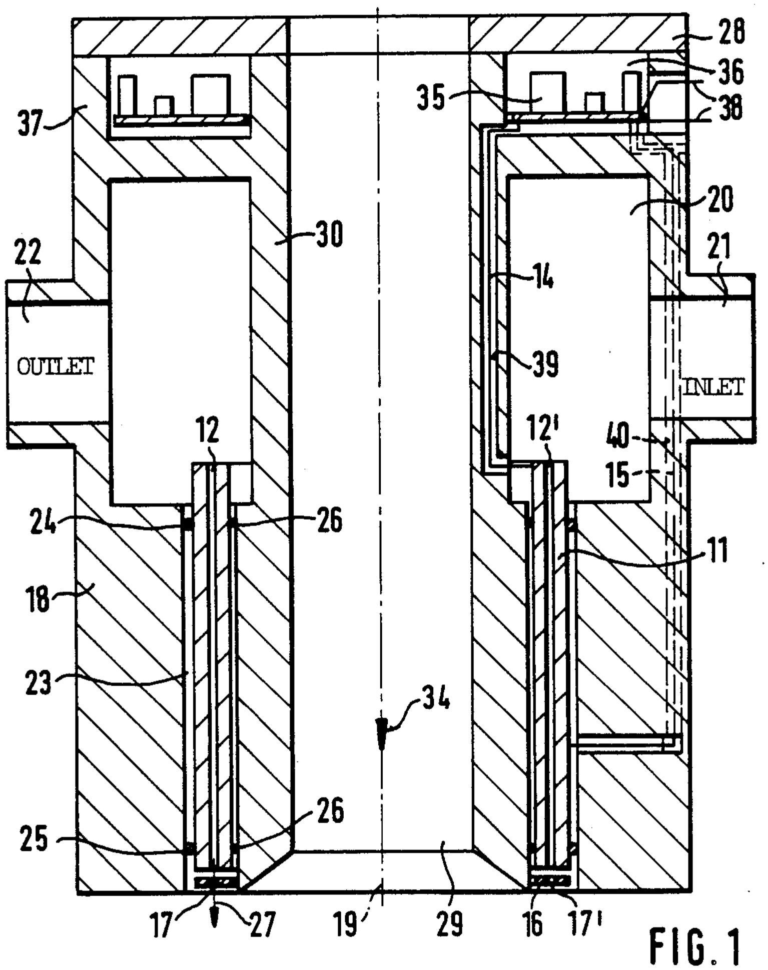
FIG. 1 is a longitudinal section through the fuel-injection valve with integrated high-voltage generator.

The fuel-injection valve is shown enlarged in FIG. 1.

An essential part of the fuel-injection valve of FIG. 1 is a hollow cylindrical radial oscillator 11 of piezoelectric material. Within the hollow cylindrical radial oscillator between its inner wall and the outer wall, a number of fuel-receiving chambers 12, 12' are arranged. The fuel-receiving chambers lie in a neutral axis of the radial oscillator and are developed as continuous bores, and therefore open on top and on bottom, of constant diameter. They extend parallel and concentric to the longitudinal axis 19.

The inner wall and the outer wall of the radial oscillator are both provided with an electrode, which electrodes are indicated merely by the feed lines 14 and 15 respectively.

Facing the lower side of the fuel-receiving chambers 12, 12' there is an annular diaphragm 16 which has bores 17, 17' which are aligned with the chambers and determine the droplet size.

The radial oscillator and the annular diaphragm are mounted in a block 18 so that the annular diaphragm 16 with the bores 17, 17' and the chambers of the radial oscillator 11 respectively can inject fuel downwards.

The fuel feed path to the annular oscillator is arranged in the upper part of the rigid block which is substantially of rotational symmetry around the longitudinal axis 19 and which, in the same way as the cover 28, consists of electrically shielding metal. The fuel feed path consists essentially of an annular constant-volume chamber 20 into which a fuel feed nipple 21 and a fuel discharge nipple 22 debouch. The free cross sections of the nipples 21 and 22 are small as compared with the area of the inner wall of the constant-volume chamber.

The radial oscillator 11 is inserted, sealed by packings 24–26, in an annular recess 23 in the block 18.

The block 18 and the cover 28 are traversed by a central passage bore 29 which is provided for the feeding of intake air in the main direction of flow indicated by the arrow 34. The high voltage necessary for the operation of the piezoelectric radial oscillator is produced in a high-voltage generator 35 which is located in a shielding chamber 36 at the upper end of the block 18. The shielding chamber is closed off from the passage bore 29 by a wall 30 and from the outside substantially by a wall 37. At its top the shielding chamber is closed by the cover 28. For the feeding of a supply voltage which is an alternating voltage of relatively small amplitude, there is provided a connector 38 which has been shown only in very simplified fashion in the drawing. The high voltage produced in the high-voltage generator 35 out of the low alternating voltage is conducted to the electrodes of the radial oscillator via the lines 14, 15 which are conducted advantageously shielded in bores 39, 40 in the wall of the block.

The high-voltage generator and the feed lines 14, 15 conducting the high voltage are so arranged in the block that practically no disturbing fields can emerge from the block.

Upon the application of high voltage to the feed lines 14, 15 and the electric field formed accordingly between the inner wall and the outer wall of the radial oscillator, a change in volume takes place in the chambers 12, 12' in the ring oscillator. The fuel flowing into these fuel-receiving chambers from the constant-volume chamber 20 is injected substantially downwards through the bores 17, 17' of the annular diaphragm 16 into the volume surrounding the fuel-injection valve. The preferred direction of movement 27 of the fuel thus extends in the direction indicated by the arrow in the drawing. On the other hand, fuel cannot substantially flow back upwards from the chambers 12, 12' into the constant-volume chamber 20 since the latter is filled with a large volume of substantially non-compressible fuel. The fuel-receiving chambers 12, 12' can therefore be developed as a continuous bore, which is favorable for manufacture.

By the inner intake air which is conducted through the continuous bore 29, there is effected a widening of the atomized fuel which is injected in the preferred direction of movement 27 from the bores 17, 17' into the volume, for instance, of a central injection system. The high-voltage generator 35 is at the same time cooled by the intake air.

Figure 2:
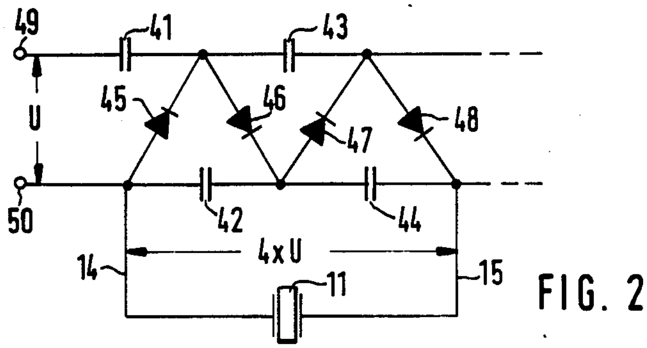
FIG. 2 is a diagrammatically shown high-voltage generator circuit.

A high-voltage generator circuit is shown in simplified form in FIG. 2. It comprises, in inexpensive fashion, a cascade circuit consisting of capacitors 41, 42, 43, 44 and diodes 45, 46, 47, 48. Terminals 49, 50 which correspond to the connector 38 serve for the connecting of the supply alternating voltage of relatively low amplitude. A for instance quadrupled, rectified voltage formed by the cascade is fed via the lines 14, 15 to the piezoelectric radial oscillator 11. The cascade can be expanded practically as desired in order to obtain an even higher voltage multiplication.

I claim:

1. An electrically actuatable fuel-injection throttle comprising:
   - a block;
   - a piezoelectric oscillator mounted within said block and being formed as a hollow cylindrical radial oscillator having a longitudinal axis;
   - a plurality of continuous fuel-receiving chambers arranged within a wall of said block and extending parallel to said longitudinal axis and concentric to said longitudinal axis;
   - an annular constant-volume chamber which is formed out of said block concentrically to said longitudinal axis, one end of said radial oscillator extending with said fuel receiving chamber into said annular chamber;
   - a high voltage generator operatively connected to said piezoelectric oscillator;
   - a constant volume chamber and a central passage bore for conduction of intake air; and
   - a shielding chamber which encloses said high-voltage generator being developed annularly and concentrically to said longitudinal axis and separated from said constant-volume chamber,
   - said annular shielding chamber adjoining said central passage bore.

2. A throttle according to claim 1 wherein said generator comprises a set of diodes and a set of capacitors connected in cascade arrangement for developing high voltage.

* * * * *